United States Patent [19]
Hartzell, Jr.

[11] 4,144,764
[45] Mar. 20, 1979

[54] SERVO AMPLIFIER FOR AN ELECTRICALLY DAMPED ACCELEROMETER

[75] Inventor: Robert E. Hartzell, Jr., Voorhees, N.J.

[73] Assignee: Schaevitz Engineering, Pennsauken, N.J.

[21] Appl. No.: 905,012

[22] Filed: May 11, 1978

[51] Int. Cl.² ............................................. G01P 15/08
[52] U.S. Cl. ..................... 73/497; 73/517 B; 318/615; 318/651
[58] Field of Search ............... 73/516 R, 517 B, 497; 318/611, 615, 616, 619, 651

[56] References Cited

U.S. PATENT DOCUMENTS 3,030,814  4/1962  Ainsworth ................... 73/517 B X
3,708,754  1/1973  Diehl ............................ 318/619 X Primary Examiner—James J. Gill
Attorney, Agent, or Firm—Edward M. Farrell

[57] ABSTRACT

A servo amplifier system for an accelerometer includes a torque coil. A torque coil is included in the output circuit of a first amplifier. A position sensor circuit develops a signal corresponding to the position of the coil which is applied to the input circuit of the first amplifier. An element, which may be a resistor, senses the current through to the coil and produces a voltage which is applied to a second amplifier having a low impedance output circuit. The output signal from the second amplifier is fed back to the input circuit of the first amplifier. Means are associated with the second amplifier to comply with the scaling and bandwidth requirements of the system.

9 Claims, 1 Drawing Figure

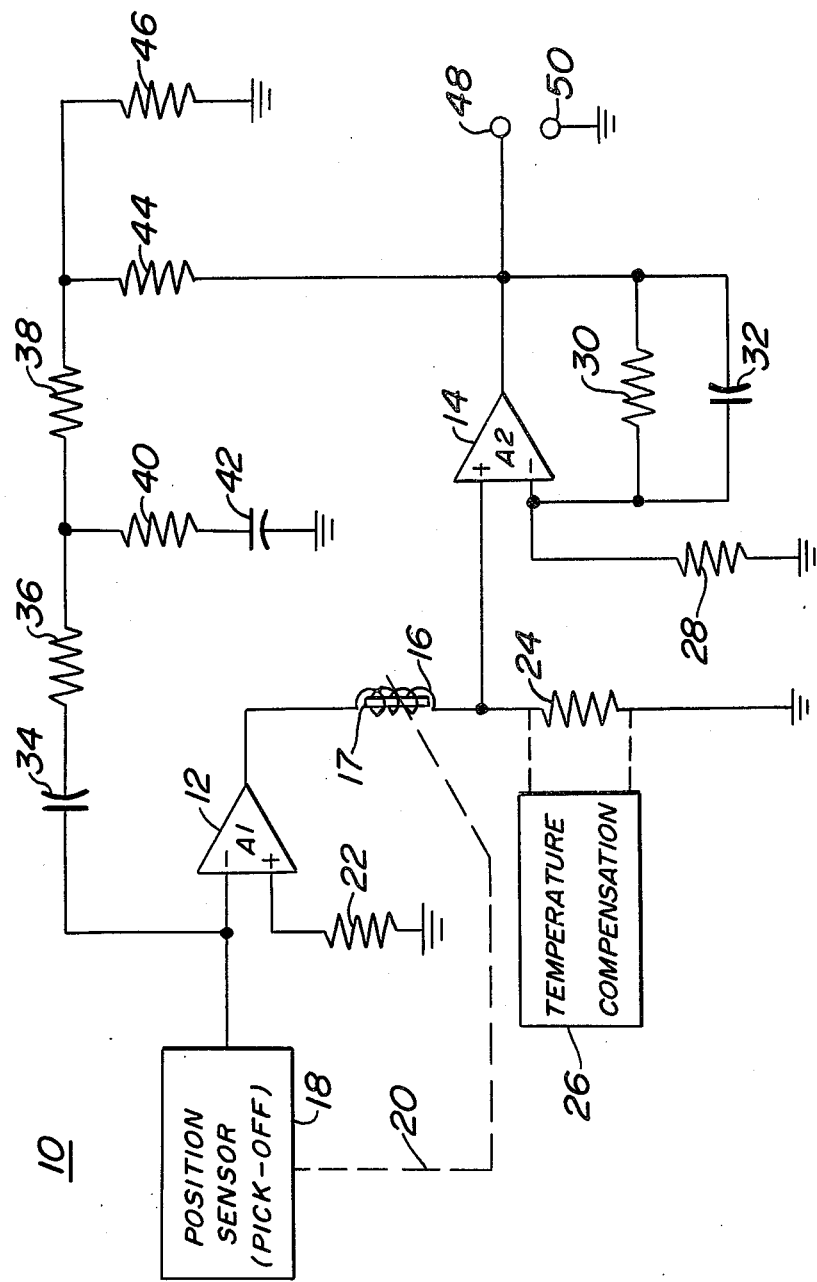

SERVO AMPLIFIER FOR AN ELECTRICALLY DAMPED ACCELEROMETER

Linear servo accelerometer systems and various circuits and mechanical arrangements associated therewith are well known.

Such systems may, for example, include means to permit a movable mass to be freely moved in a pivot assembly in response to acceleration forces. The movable mass or seismic element, as in the present invention, is connected to a torque coil to generate signals in a position sensor which are used as error signals. In some cases, the torque coil itself may comprise the seismic element.

Position detector means, which do not form a direct part of the subject invention, are generally employed with servo amplifiers of the type involving the subject invention. A position sensor is used to generate a signal corresponding to the position of the seismic element. This signal is generally applied to an input circuit of an amplifier included in a servo loop. The output signal from the servo amplifier, which could be considered an error signal, is applied to a torque coil which tends to force back the coil to the position it was at before acceleration forces were applied. Hence, this may be considered as a forced balanced type of accelerometer. A general arrangement of a force balance accelerometer is illustrated in a patent to Moskowitz, U.S. Pat. No. 3,389,608 issued June 25, 1968.

One type of position sensor could be an oscillator in which a conductive element, which may be the seismic element, is coupled to the frequency determining tank circuit of the oscillator. When the conductive element is moved, the amplitude of the oscillator is correspondingly varied. A rectifier circuit may be provided for rectifying the output of the oscillator. The torque coil is generally physically connected to the conductive element. The output signal from the rectifying circuit is connected to the torque coil and in effect is used to oppose the acceleration forces applied to the conducting element by restoring the torque coil to a null position.

The invention involved in this application is related to a servo amplifier of the type which is used to apply the restoring current to the torque coil after it has been moved in response to acceleration forces. Therefore, detailed showing of associated prior art arrangements as discussed above is omitted because they are well known to those skilled in the art and only incidentally related to the present invention.

The subject invention is directed towards minimizing a number of disadvantages found in prior art arrangements with a minimum amount of additional complex circuitry. Among some of the things which must be considered in a servo amplifier used in accelerometer systems are varying load conditions under which the amplifier must operate, varying scaling factors or ranges in which the amplifier must operate, and the bandwidths of operation of the amplifier. In general, complex circuitry, often involving additional amplifiers, are often used to solve one or more of these problems.

It is an object of this invention to provide an improved servo amplifier for an accelerometer which has a low output characteristic impedance to permit varying loads to be connected thereacross without substantially affecting the scaling or frequency response of the amplifier.

It is a further object of this invention to provide an improved servo amplifier for an accelerometer in which the scaling or range of the amplifier may be readily varied by varying the values of a minimum number of electrical components.

It is still a further object of ths invention to provide an improved servo amplifier for an accelerometer in which the bandwidth response of the amplifier is controlled with a minimum amount of circuitry.

In accordance with the present invention, a servo amplifier system for an electrically damped accelerometer is provided. Electrical signals representative of the position of a movable element subject to acceleration forces are applied to a first operational amplifier. A torque coil, also movable in accordance with the movable element, is connected in the output circuit of the first operational amplifier.

The torque coil is connected to a resistor. The signal developed across the resistor is applied to a second operational amplifier, which has a low output impedance. The output signal from the second amplifier is fed back in a closed servo loop to the input circuit of the first operational amplifier. A circuit connected in the second amplifier includes means for controlling the scaling and bandwidth of operation of the servo system. A load or utilization circuit is also connected to the output circuit of the second amplifier.

Other objects and advantages of the present invention will be apparent and suggest themselves to those skilled in the art from a reading of the following specification and claims, taken in conjunction with the accompanying sole FIGURE of the drawing which is a schematic electrical diagram illustrating one form of the present invention Referring to the sole FIGURE of the drawing, a servo amplifier system 10 comprises first and second operational amplifiers 12 and 14. A torque coil 16 is disposed in a magnetic field produced by a magnet 17 or other means to normally maintain the torque coil in a null position. It is electrically connected in the output circuit of the amplifier 12. The torque coil 16 may be physically connected to the movable mass comprising the seismic element which is directly moved by the acceleration forces.

The position of the torque coil 16 is detected by a position sensor 18. The coupling between the torque coil 16 and position sensor 18 is illustrated by dashed lines 20. This coupling could represent a conductive arm or paddle magnetically coupled to the tank circuit of an oscillator to vary the amplitude thereof in accordance with the position of the arm. The position sensor 18 may comprise an oscillator of the type previously mentioned in discussion of the prior art.

The output signal from the position sensor 18 is applied to one of the input terminals of the amplifier 12. A second feedback signal, which will be described, is also applied to the same input terminal. A resistor 22 connects the other terminal of the amplifier 12 to ground. The resistor 22 provides a reference signal for the operation of the amplifier 12.

The output circuit of the amplifier 12 includes the torque coil 16 and a resistor 24. The resistor 24 may be considered as a current sensing element to develop a signal corresponding to the current passing through the coil 16 as a result of movement thereof resulting from acceleration forces. Temperature compensation means 26, which may include a thermistor or other circuitry, may be connected across the resistor 24.

The signal developed across the resistor 24 is applied to one of the input terminals of the second operational amplifier 14. The other input terminal of the amplifier 14 includes a resistor 28 connected to ground. The output circuit of the amplifier 14, which has a very low characteristic impedance is connected to provide a number of functions. The output signal from the amplifier 14 is fed back across the resistor 28 through a parallel circuit including a resistor 30, which may be variable or adjustable, and a capacitor 32. The ratio of the values of the resistors 30 and 28 provide a multiplication factor of the voltage which is generated between the torque coil 16 and resistor 28. The capacitor 32, in combination with the resistor 30 provides a low pass filter which limits the bandwidth of the servo amplifier 10. The multiplied voltage is developed at the output circuit of the amplifier 14 as a voltage which is proportional to acceleration.

A feedback path is connected from the output circuit of the amplifier 14 to the input circuit of the amplifier 12. This feedback circuit includes a capacitor 34, resistors 36, 38, and 40, and a capacitor 42. The elements in the feedback path which comprise frequency sensitive components and are selected in accordance with the frequencies involved in the system. Resistors 44 and 46 are the gain sensitive components and are selected in accordance with the gain characteristics of the system. The resistor 46 may be variable.

With the feedback arrangement illustrated, dynamic error signals are fed back to the input circuit of the amplifier 12, with compensation being subsequently made within the limits of the bandwidth of the system.

The output signal from the amplifier 14 is also applied across a pair of output terminals 48 and 50, with the terminal 50 being grounded. The terminals 48 and 50 may be connected to various utilization circuits or devices which may take a wide variety of different forms and have different degrees of loading.

The load connected across the output terminals 48 and 50 is connected across the low impedance of the amplifier 14. Because of the low output impedance of the amplifier 14, any load impedance connected to the output terminals 48 and 50 will not be reflected in the scaling or frequency responses of the system.

It is recognized that features described in connection with the system described are generally applicable to many servo amplifier accelerometer systems. Values of the various components are subject to variations dependent upon the particular type of system involved and accelerometer used.

The circuit illustrated, while applicable to many systems, has been successfully involved in systems involving LSB-Servo Force Rebalance Linear Accelerometers of the type manufactured by Schaevitz Engineering, Pennsauken, New Jersey. The types of operational amplifiers illustrated may be of the type manufactured by Precision Monolithics (Model OPO1CJ). Typical values of the components involved for one particular application are as follows:

Resistor 22—20 K ohms
Resistor 24—20 ohms
Resistor 28—20 ohms
Resistor 30—180–3600 ohms (variable)
Resistor 36—33 K ohms
Resistor 38—33 K ohms
Resistor 40—3.3 K ohms
Resistor 44—5.6 K ohms
Resistor 46—12 K ohms (variable).
Capacitor 32—1 micro farad
Capacitor 34—0.56 micro farad
Capacitor 42—0.1 to 0.22 micro farad It is understood that the above values and model references are intended to be merely illustrative and not for the purposes of limiting the invention as defined in the claims.

What is claimed is:

1. In combination with a position detector for producing electrical signals corresponding to positions of a torque coil subject to movements resulting from acceleration forces, a servo amplifier system for producing error signals for application to said torque coil to counteract the movements resulting from said acceleration forces, comprising:

a. a first amplifier having input and output circuits;
b. said torque coil being included in said output circuit of said first amplifier;
c. means for applying said electrical signals from said position detector to said input circuit of said first amplifier;
d. a second amplifier having an input circuit and a low impedance output circuit;
e. a load element in said input circuit of said second amplifier connected to said torque coil to develop a voltage thereacross corresponding to the induced current through said torque coil resulting from movement thereon;
f. a feedback network connected from the output circuit of said second amplifier to the input circuit of said first amplifier;
g. utilization means connected to the output circuit of said second amplifier.

2. A combination as set forth in claim 1 wherein said load element comprises a first resistor connected to said torque coil with the voltage developed thereacross resulting from current through said torque coil being applied to said second amplifier.

3. A combination as set forth in claim 2 wherein a second resistor is applied across the input circuit of said second amplifier and a filter network is connected between the output circuit of said second amplifier to said second resistor.

4. A combination as set forth in claim 3 wherein said filter network comprises a third resistor and a capacitor connected in parallel to control the frequency bandwidth of said servo amplifier system.

5. A combination as set forth in claim 4 wherein the ratio of the values of said second and third resistors control the range of operation of said servo amplifier system.

6. A combination as set forth in claim 5 wherein temperature compensation means is connected across said first resistor.

7. A combination as set forth in claim 6 wherein a fourth resistor is provided in the input circuit of said first amplifier to control the voltage reference level of operation of said first amplifier.

8. A combination as set forth in claim 7 wherein said feedback network includes resistive and capacitive elements for controlling the characteristics of the frequencies of the signals fed back.

9. A combination as set forth in claim 8 wherein additional resistive elements are included in said feedback network to control the gain of the fed back signals.

* * * * *